(12) United States Patent
Jungert et al.

(10) Patent No.: US 7,436,238 B2
(45) Date of Patent: Oct. 14, 2008

(54) INTEGRATED VOLTAGE SWITCHING CIRCUIT

(75) Inventors: Horst Jungert, Buch am Erlbach (DE); Werner Elmer, Moosburg (DE)

(73) Assignee: Texas Instruments Deutschland GmbH, Freising (DE)

( * ) Notice: Subject to any disclaimer, the term of this patent is extended or adjusted under 35 U.S.C. 154(b) by 23 days.

(21) Appl. No.: 11/673,847

(22) Filed: Feb. 12, 2007

(65) Prior Publication Data

US 2007/0205821 A1 Sep. 6, 2007

Related U.S. Application Data

(60) Provisional application No. 60/882,433, filed on Dec. 28, 2006.

(30) Foreign Application Priority Data

Feb. 13, 2006 (DE) ...................... 10 2006 006 541

(51) Int. Cl.
*H03K 17/00* (2006.01)

(52) U.S. Cl. .................... 327/407; 327/99; 327/318; 327/408; 333/101; 361/91.1

(58) Field of Classification Search ............... 327/99, 327/308, 318–321, 327, 328, 407, 408, 411; 333/101, 81 R; 361/88, 90, 91.1, 91.2, 91.5
See application file for complete search history.

(56) References Cited

U.S. PATENT DOCUMENTS 4,205,240 A * 5/1980 Plaige ......................... 327/82

| | | | | |
|---|---|---|---|---|
| 5,650,741 A | * | 7/1997 | Nakamura et al. | 327/327 |
| 6,271,692 B1 | | 8/2001 | Iihoshi et al. | |
| 6,573,751 B1 | | 6/2003 | Seki | |
| 6,614,282 B2 | * | 9/2003 | Abe et al. | 327/321 |
| 6,794,921 B2 | * | 9/2004 | Abe et al. | 327/309 |

FOREIGN PATENT DOCUMENTS

DE 27 46 264 6/1978

OTHER PUBLICATIONS

McAdams, H., et al.: "A 1-MBIT CMOS Dynamic RAM With Design-For Test Functions," IEEE Journal of Solid-State Circuits, IEEE Service Center, Piscataway, NJ, US, vol. SC-21, No. 5, Oct. 1, 1986, pp. 635-642.

* cited by examiner

*Primary Examiner*—N. Drew Richards
*Assistant Examiner*—Patrick O'Neill
(74) *Attorney, Agent, or Firm*—Warren L. Franz; Wade J. Brady, III; Frederick J. Telecky, Jr.

(57) ABSTRACT

An integrated circuit can be switched between operating modes without the need for a dedicated mode selection pin. A circuit for operation at a specified maximum supply voltage comprises first and second supply terminals, a first signal input for application of a regular input signal, a second signal input, and an output. The circuit further comprises a multiplexer with first and second inputs connected to the first and second signal inputs, respectively, for selectively switching either of the first and second signal inputs to the output under control of a selection signal. A gate circuit provides the selection signal to the multiplexer. The input of the gate circuit is driven by control circuitry. Clamping circuitry is provided that limits the voltage at the first input of the multiplexer. With such a circuit design, a relatively high voltage applied to the first signal input will switch the circuit to another operating mode, such as a test mode.

8 Claims, 1 Drawing Sheet

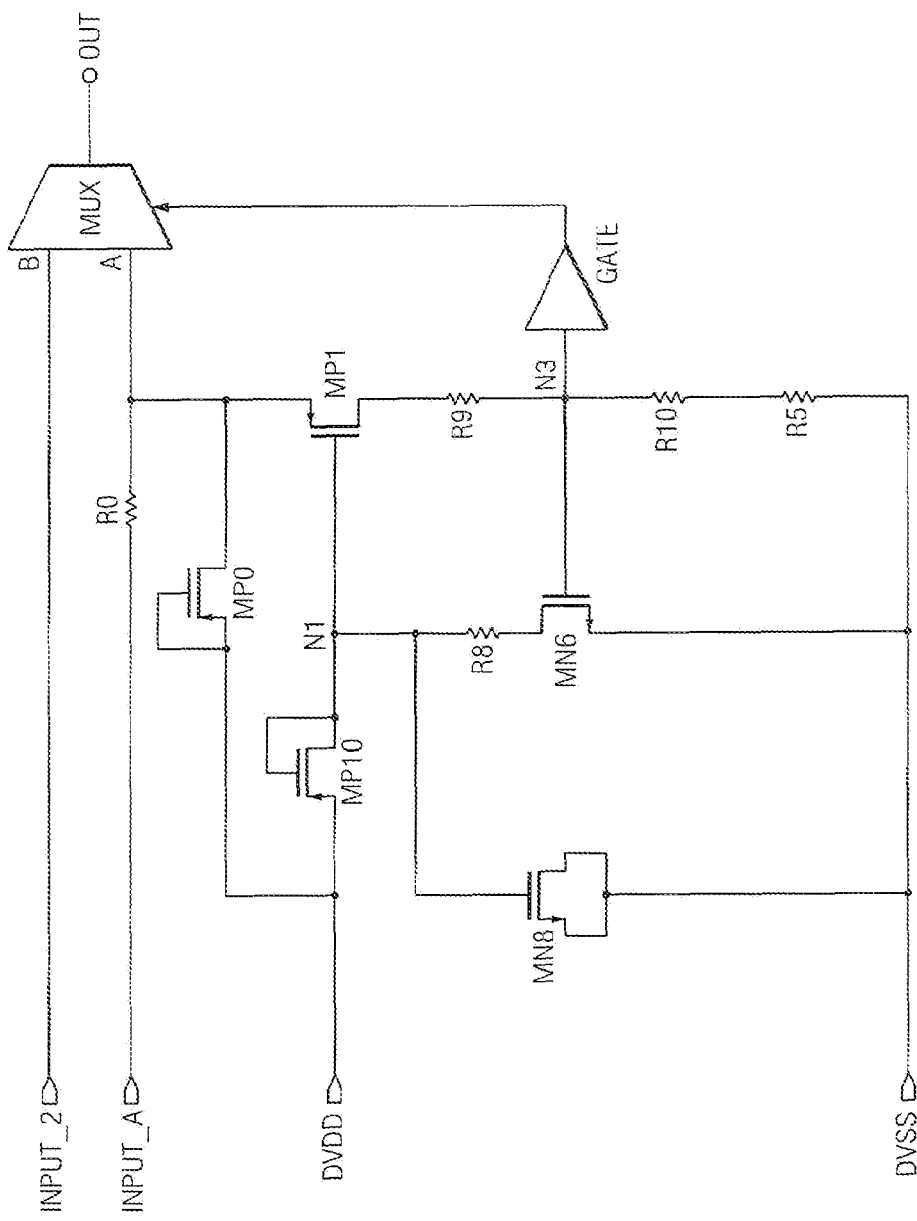

INTEGRATED VOLTAGE SWITCHING CIRCUIT

CROSS-REFERENCE TO RELATED APPLICATIONS

This application claims foreign priority under 35 USC 119 of DE 10 2006 006 541.7 filed Feb. 13, 2006; and also claims domestic priority under 35 USC 119 of U.S. 60/882,433 filed Dec. 28, 2006.

FIELD OF THE INVENTION

The invention relates to an integrated circuit for operation at a specified maximum supply voltage.

BACKGROUND

Integrated circuits sometimes need to be switched to a special operating mode, such as a test mode. Switching a circuit to a particular mode of operation is conventionally done by providing a dedicated mode selection pin on the integrated circuit and applying a mode control signal to that pin.

SUMMARY

The invention provides an integrated circuit that can be switched to a particular operating mode even when a dedicated mode selection pin is not available for some reason.

Specifically, in a described embodiment, the invention provides an integrated circuit for operation at a specified maximum supply voltage that comprises first and second supply terminals, a first signal input for application of a regular input signal, a second signal input and an output. The described integrated circuit embodiment further comprises a multiplexer with first and second inputs connected to the first and second signal inputs, respectively, for selectively switching either of the first and second signal inputs to the output under control of a selection signal. A gate circuit provides the selection signal to the multiplexer. The input of the gate circuit is driven by control circuitry. Clamping means are provided that limit the voltage at the first input of the multiplexer. The control circuitry comprises voltage detection means for detecting a voltage at the first signal input that exceeds the specific maximum supply voltage by a limited amount and, in response, applying a drive signal to the input of said gate circuit.

With such a circuit design, a relatively high voltage can be applied to the first signal input instead of the regular input signal to switch the circuit to a particular operating mode such as a test mode. The relatively high voltage at the first signal input will be detected by the voltage detection means to activate the multiplexer to switch its output from the first to the second signal input. The second input can be connected to any external signal source, or to any node internal of the integrated circuit, depending on the particular application. Application of a relatively high voltage to the signal input of the integrated circuit is tolerable due to the provision of the clamping means that prevents an over-stress at the gate oxide of the input transistors.

In a specific embodiment, a 0.18 μm process technology is used and the maximum admitted supply voltage is 1.8 Volt. A voltage of, for example, one Volt in excess of the 1.8 Volt supply voltage, applied to the first signal input of the integrated circuit, would switch the circuit to the test mode by routing the second signal input to the output, without damage to the voltage-sensitive components of the circuit.

In a preferred embodiment of the invention, the clamping means simply includes a resistor connected between the first signal input and the corresponding first input of the multiplexer, and a diode-connected MOS transistor connected between the first input of the multiplexer and the first supply terminal. This ensures a reliable clamping action even up to input voltages as high as 8V. For the voltage detection means, a preferred implementation is with just a few basic devices, such as MOS transistor and resistor structures.

BRIEF DESCRIPTION OF THE DRAWINGS

Further details of the invention will become apparent to those skilled in the art to which the invention relates, from the following description with reference to the appended drawing. The single figure of the drawing is a schematic circuit diagram of an example preferred implementation.

DETAILED DESCRIPTION

With reference to the drawing, an input section of an integrated circuit is shown with two signal inputs INPUT_1 and INPUT_2, and two supply terminals DVDD and DVSS. The first signal input INPUT_1 is connected to a first input A of a multiplexer MUX through a resistor R0, and the second signal input INPUT 2 is directly connected to an input B of multiplexer MUX, which has an output OUT. A diode-connected PMOS transistor MP0 is connected between the input A of multiplexer MUX and supply terminal DVDD. Also connected between the input A of multiplexer MUX and supply terminal DVSS is a series circuit comprising a resistive divider with resistors R9, R10 and R5, and the a PMOS transistor MP1. The gate of PMOS transistor MP1 is shown connected to receive its bias from a diode-connected PMOS transistor MP10 connected to supply terminal DVDD. A series circuit of a resistor R8 and an NMOS transistor MN6 is connected between supply terminal DVSS and a connection node N1 of transistor MP 10 with the gate of transistor MP1. Transistor MN6 has its gate connected to a node N3 at the connection of resistors R9 and R10. Node N3 is also connected to the input of a gate circuit GATE, the output of which is connected to a control input of multiplexer MUX. An NMOS transistor MN8 is mounted as a gate-to-source/drain capacity and connected between node N1 and terminal DVSS to stabilize the voltage level at node N1.

The maximum allowed supply voltage of an integrated circuit depends on the process technology employed for its fabrication. Signal inputs to the circuit can accept voltage values slightly above the specified maximum voltage without damage to the gate oxide of the input stage transistors. For example, with a 0.18 μm technology, the specified maximum supply voltage is 1.8 Volt, and the voltage at the signal input may exceed that value by approximately 1 Volt.

The integrated circuit can be operated in two modes. In a normal mode of operation, an input signal (analog or digital) is applied to signal input INPUT_1 at a voltage within the range of the specified maximum supply voltage. In this condition, transistor MP1 is off, the node N3 is substantially at the voltage level of terminal DVSS (normally the ground level) and the output of gate circuit GATE is low. A low output of the gate circuit controls the multiplexer MUX to connect its input A to its output OUT.

In a separate mode of operation which can be a test mode, for example, a voltage level in excess of the maximum specified supply voltage by a limited amount is applied to the signal input INPUT 1. If the voltage level at signal input INPUT_1 exceeds the supply voltage at terminal DVDD by a given amount of approx. 1 Volt in this example, transistor MP1 starts conducting, and node N3 is raised. As soon as the voltage level at node N3 reaches the threshold value of transistor MN6, the latter will start conducting, pulling down the level at node N1 and increasing the conductance of transistor MP1. Node N3 is raised to a stable logic state "HIGH" and gate circuit GATE changes its output to logic "HIGH," thereby controlling multiplexer MUX to connect the second signal input INPUT_2 to its output OUT.

The second signal input INPUT_2 can be connected to any external or internal signal source, as required by a particular application. With this concept, the circuit can be switched to a particular mode of operation without the requirement for a dedicated mode selection pin. The "mode switching voltage" applied to the first signal input INPUT_1 can even be far in excess of the specified maximum supply voltage because the resistor R8 in conjunction with transistor MP0 constitutes an effective voltage clamping circuit that limits the voltage level at input A of multiplexer MUX to an acceptable amount. In the example disclosed, the voltage level at signal input INPUT_1 can be raised to a value as high as 8 Volt. Diode-connected transistor MP10 limits the voltage level at node N1 to DVDD less the diode voltage when transistor MN6 is conducting, thereby providing a well-defined gate voltage to transistor MP1. Transistor MP10 will conduct only when the level at INPUT_1 is at least one diode voltage above DVDD. Accordingly, the voltage level at node A is limited to DVDD plus one diode voltage.

For a proper operation of the circuit, transistor MP1 must start conducting before transistor MP0. This condition is satisfied by an appropriate sizing ratio on the chip die between transistors MP1 and MP0.

Those skilled in the art to which the invention relates will appreciate that the foregoing example implementation is but one of the many implementations that may be employed within the scope of the claimed invention.

What is claimed is:

1. An integrated circuit for operation at a specified maximum supply voltage, comprising:
   first and second voltage supply terminals;
   a first signal input for application of a regular input signal;
   a second signal input;
   an output;
   a multiplexer with first and second inputs respectively coupled to the first and second signal inputs, for selectively switching either of the first and second signal inputs to the output under control of a selection signal;
   a gate circuit providing the selection signal to the multiplexer;
   clamping circuitry connected to limit the voltage at the first input of the multiplexer; and
   control circuitry connected and configured to detect a voltage at the first signal input that exceeds a maximum supply voltage by a given amount and for driving an input of said gate circuit in response thereto.

2. The integrated circuit of claim 1, wherein the clamping circuitry comprises a first resistor connected between the first signal input and the first input of the multiplexer, and a diode-connected first MOS transistor connected between the first input of the multiplexer and the first voltage supply terminal.

3. The integrated circuit of claim 2, wherein the control circuitry comprises a second MOS transistor and a resistive divider, the channel of the second MOS transistor being connected in series with the resistive divider between the first input of the multiplexer and the second voltage supply terminal; the resistive divider having a node connected to the input of the gate circuit; and the second MOS transistor having a gate controlled by biasing circuitry.

4. The integrated circuit of claim 3, wherein the biasing circuitry includes a diode-connected third MOS transistor connected between the first voltage supply terminal and the gate of the second MOS transistor, and a second resistor and fourth MOS transistor having a channel connected in series with the second resistor between the gate of the second MOS transistor and the second voltage supply terminal (DVSS) and a gate connected to the node of the resistive divider.

5. The integrated circuit of claim 4, wherein the second MOS transistor is dimensioned substantially larger than the diode-connected first MOS transistor.

6. The integrated circuit of claim 3, wherein the second MOS transistor is dimensioned substantially larger than the diode-connected first MOS transistor.

7. The integrated circuit of claim 6, wherein the biasing circuitry includes a diode-connected second MOS transistor connected between the first voltage supply terminal and the gate of the first MOS transistor, and a resistor and third MOS transistor having a channel connected in series with the resistor between the gate of the first MOS transistor and the second voltage supply terminal (DVSS) and a gate connected to the node of the resistive divider.

8. The integrated circuit of claim 1, wherein the control circuitry comprises a first MOS transistor and a resistive divider, the channel of the first MOS transistor being connected in series with the resistive divider between the first input of the multiplexer and the second voltage supply terminal; the resistive divider having a node connected to the input of the gate circuit; and the first MOS transistor having a gate controlled by biasing circuitry.

* * * * *